(12) United States Patent
Leonardi

(10) Patent No.: US 6,525,392 B1
(45) Date of Patent: Feb. 25, 2003

(54) SEMICONDUCTOR POWER DEVICE WITH INSULATED CIRCUIT

(75) Inventor: Salvatore Leonardi, Aci S. Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/352,477

(22) Filed: Jul. 13, 1999

(30) Foreign Application Priority Data

Aug. 14, 1998 (EP) ............................................. 98830505

(51) Int. Cl.[7] .............................................. H01L 27/07
(52) U.S. Cl. ........................ 257/500; 257/499; 257/506
(58) Field of Search ................................ 257/728, 618, 257/499, 500, 506

(56) References Cited

U.S. PATENT DOCUMENTS 5,650,354 A    7/1997    Himi et al.

FOREIGN PATENT DOCUMENTS

| EP | 0 282 734 A1 | 2/1988 |
|---|---|---|
| EP | 0 322 041 A2 | 12/1988 |
| EP | 0 509 183 A1 | 4/1991 |
| EP | 0 646 965 A1 | 9/1993 |
| EP | 07029974 | 1/1995 |

*Primary Examiner*—Roy Potter
(74) *Attorney, Agent, or Firm*—Allen, Dyer, Doppelt, Milbrath & Gilchrist, P.A.; Lisa K. Jorgenson

(57) ABSTRACT

A semiconductor power device with an insulated control circuit is formed in a chip of semiconductor material having predominantly a first type of conductivity. The device includes a region having a second type of conductivity, buried in the semiconductor material, and at least one insulated region of semiconductor material, containing at least part of the control circuit, disposed between the front surface of the chip and the buried region. The device also includes electrical contacts for the buried region and the semiconductor material. To eliminate the effects of parasitic components, the insulated region is delimited, at least partially, by an insulating dielectric material.

20 Claims, 3 Drawing Sheets

US 6,525,392 B1

SEMICONDUCTOR POWER DEVICE WITH INSULATED CIRCUIT

FIELD OF THE INVENTION

The present invention relates to the field of semiconductors, and, more particularly, to a device including a power component and a circuit formed in a semiconductor material, and to associated methods of making the device.

BACKGROUND OF THE INVENTION

VIPower technology is known, for example, from the publication EP-A-0322041 which describes an integrated structure comprising a bipolar power transistor and a MOSFET transistor interconnected in an "emitter switching" configuration. This structure, also shown in FIG. 1 of the attached drawings, is formed on a substrate 10 of semiconductor material, for example an N+ type mono-crystalline silicon. (It should be noted that in the drawing the concentrations of the N type and P type impurities are indicated, as is usual, by adding the sign − or + to the letters N and P; the letters N and P without the addition of a − or + sign denote concentrations having an intermediate value).

Two epitaxial layers 11 and 12, of the N− and N type respectively, are formed on the substrate 10. The layer 11, together with the substrate 10, contains the collector region of the bipolar transistor. A metal layer 28 applied on the bottom surface of the substrate provides the collector terminal C.

A P− region 13, formed between the epitaxial layers 11 and 12, and therefore "buried" between them, provides the base region of the transistor. A P+ insulation and deep contact base region 15 extends from the front surface of the chip, in other words from the surface opposite the collector terminal C, to the edge of the base region 13, defining within it an insulated N region 16. A second buried region 14, of the N+ type, is formed on the P− region 13 in such a way as to form a junction with it, and provides the emitter region of the transistor.

Inside the insulated region 16 there extends a P region 25, formed by a surface part with a low concentration (P−) and by a deep part with a high concentration (P+) of impurities, which constitutes the "body" region of the MOSFET transistor and contains the channel of the transistor. A region 26 which constitutes the "source" region of the MOSFET transistor is formed inside the "body" region 25. A strip 22 of electrically conducting material, which lies above the channel and is insulated from the surface of the chip by a thin layer of dielectric, constitutes the "gate" electrode, which is also a terminal of the device, indicated by G.

Electrically conducting strips 4 and 5 for surface contact are formed on the source region 26 and on the insulation region 15 respectively, and constitute the source terminals S of the MOSFET transistor and the base terminal B of the bipolar transistor respectively. The drain region of the MOSFET transistor includes the part of the insulated N region 16 lying between the buried emitter region 14 and the body region 25. The region 14, in this example, is not connected to external electrodes; if necessary, however, a deep contact (sinker) N+ region, extending from the front surface of the chip to the N+ region 14, can easily be formed to connect the emitter to an external electrode or to other components integrated in the same chip.

It is often convenient to form a circuit for controlling the power device in the same chip. Such a circuit includes low-power components operating at low voltage and capable of processing and amplifying signals and of driving the power device. It is commonly formed inside a pocket having a type of conductivity which is the opposite of that of the substrate, and therefore, in this example, of the P type, insulated from the rest of the chip by a reverse-biased junction, according to the known art of junction insulation.

FIG. 2 schematically and sectionally shows the principal regions of an integrated structure of this type. The power device is identical to that shown in FIG. 1, and the control circuit, in this example, is contained in two N type regions 16', separated from each other and from the rest of the substrate by P type regions 13' and 15'. These P type regions 131 and 15' are produced at the same time as the P type regions 13 and 15. A buried N+ type region 14', produced at the same time as the region 14 of the power device, is formed on the bottom of each of the regions 16', and may provide, for example, the collector region or the drain region of a bipolar transistor or of a MOSFET transistor respectively, not illustrated further, both formed in the corresponding insulated region 16'.

The electrical insulation between the power device and the control circuit is obtained, as is known, by reverse biasing the junction which the P type pocket, formed by the buried region 13' and by the insulation regions 15', forms with the substrate. In practice, in the example illustrated, in operation, the contacts 5' are connected to a terminal at a low potential, indicated by the ground symbol in the figure, of a power source, and the terminal C is connected to a terminal at high potential, indicated by +Vcc in the figure, of the same source.

This type of insulation, although very effective in most of the present structures of integrated circuits, has not proved satisfactory in integrated power circuits made by the VIPower technology. This is because a structure of the type described above includes a large number of N type and P type regions which are biased differently. They form junctions between each other which, during the operation of the device, in which currents of 4–8 A and voltages of 1000–2000 V are present, may give rise to numerous parasitic components, for example, in SCR devices, NPN and PNP transistors and capacitive devices sensitive to variations of voltage. Depending on the type of application and specific structure, these parasitic components, possibly interacting with each other, may cause both horizontal and vertical leakage currents, thus greatly reducing the efficiency of the electrical insulation between the control circuit and the power device, as well as between the components of the control circuit itself, which are disposed in different insulated regions.

To overcome these problems, it would be necessary to forgo junction insulation in favor of a more effective insulation system, such as that which makes use of layers of dielectric material to separate the active semiconductor regions from each other. The known art, however, does not include dielectric insulation techniques compatible with the VIPower technology and capable of withstanding the high voltages which are present. In this respect it should be noted that the control circuits normally operate at voltages varying between ground potential and a relatively low positive potential, usually not exceeding 50 V. The potential of an insulated N region 16' will therefore have a value not very different from that of ground, while the potential of the N substrate may be higher, even much higher, than 1000 V. Consequently there would be very high voltages between the opposite surfaces of the dielectric layer of the insulation structure. Accordingly, very large thicknesses of dielectric, which cannot be produced by the available technologies, would be required to withstand these voltages.

SUMMARY OF THE INVENTION

An object of the present invention is to provide a semiconductor device comprising a bipolar power transistor and a MOSFET transistor interconnected in an emitter switching configuration, including an insulation structure of the control circuit which substantially prevents parasitic effects and which withstands the high operating voltages of the device.

This and other objects are achieved by a semiconductor device comprising a semiconductor material predominantly having a first type of conductivity and a power component and a control circuit formed in the semiconductor material. The device further includes a buried region having a second type of conductivity, buried in the semiconductor material and at least one insulated region of semiconductor material, containing at least part of the control circuit, disposed between a front surface of the device and the buried region. The insulated region is at least partially delimited by an insulating dielectric material. The device includes electrical contacts for each of the buried region and the semiconductor material.

Additionally, the insulating dielectric material may comprise a bottom layer which extends over the buried region and/or a wall which surrounds the insulated region. Also, the electrical contact for the buried region may comprise an electrically conductive element which extends through a portion of the wall, and is in contact with the buried region. Furthermore, in one embodiment, at least part of the wall may extend to a bottom of the buried region to laterally delimit the buried region.

The electrical contact for the buried region preferably includes a surface contact electrode adjacent the front surface of the device and a connecting region having the second type of conductivity, and extending from the surface contact electrode to the buried region. Also, the insulated region preferably has the first type of conductivity.

A method of making a semiconductor device including a power component and a control circuit as set forth above, includes the steps of forming a buried region having a second type of conductivity in a semiconductor material and providing an insulating dielectric material to define at least one insulated region between a front surface of the device and the buried region, the insulated region containing at least part of the control circuit. Also, the step of providing an insulating dielectric material preferably includes the steps of implanting oxygen at predetermined portions of the semiconductor material and forming at least one layer of silicon dioxide buried in the semiconductor material by annealing the oxygen implanted portions.

BRIEF DESCRIPTION OF THE DRAWINGS

The invention will be more clearly understood from the following detailed description of an embodiment thereof, provided, by way of example and therefore without limitation, in relation to the attached drawings, in which.

DETAILED DESCRIPTION OF THE PREFERRED EMBODIMENTS

Figure 1:
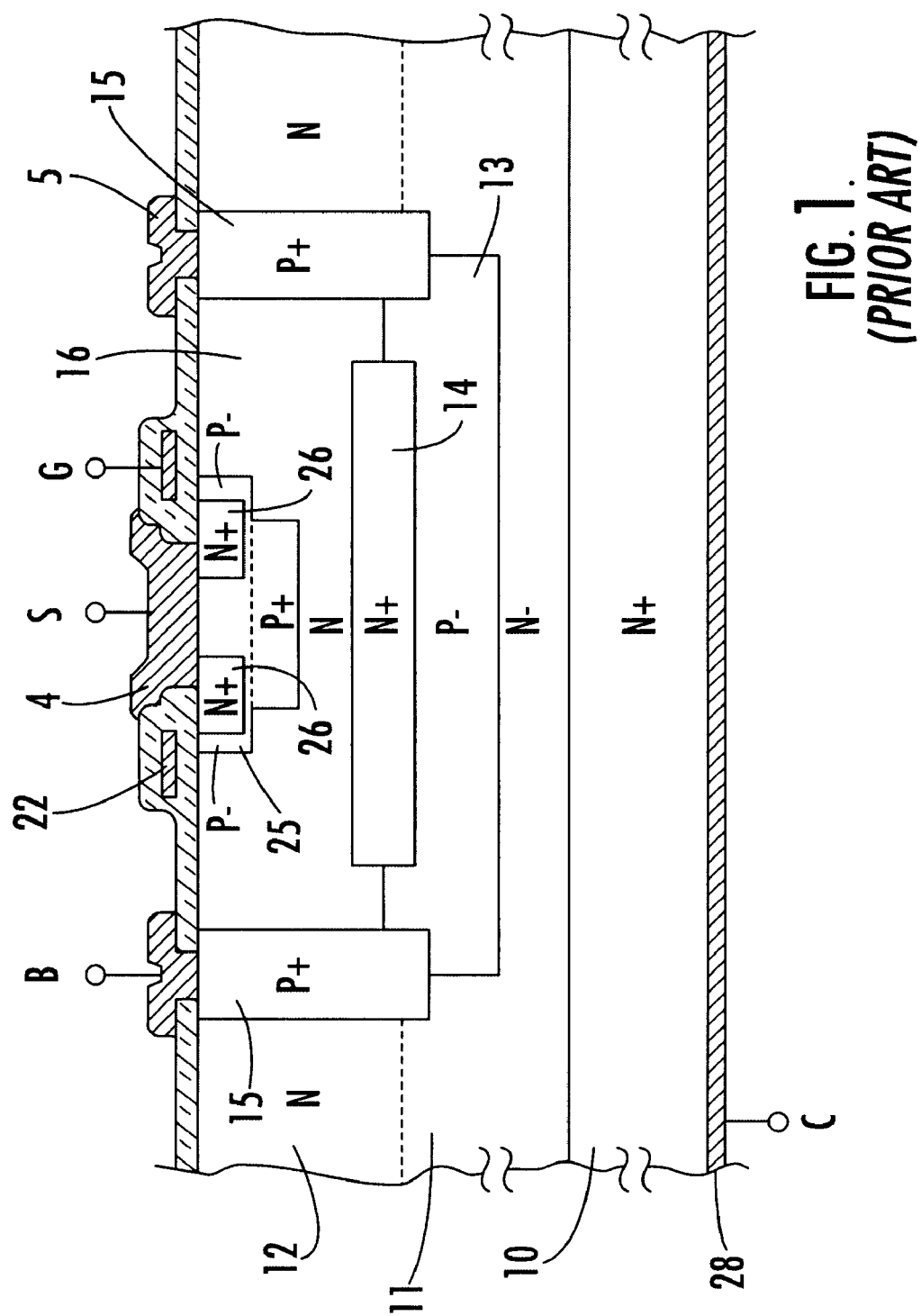
FIG. 1 is a sectional view of a portion of a chip of semiconductor material which illustrates a prior art power device.
Figure 3:
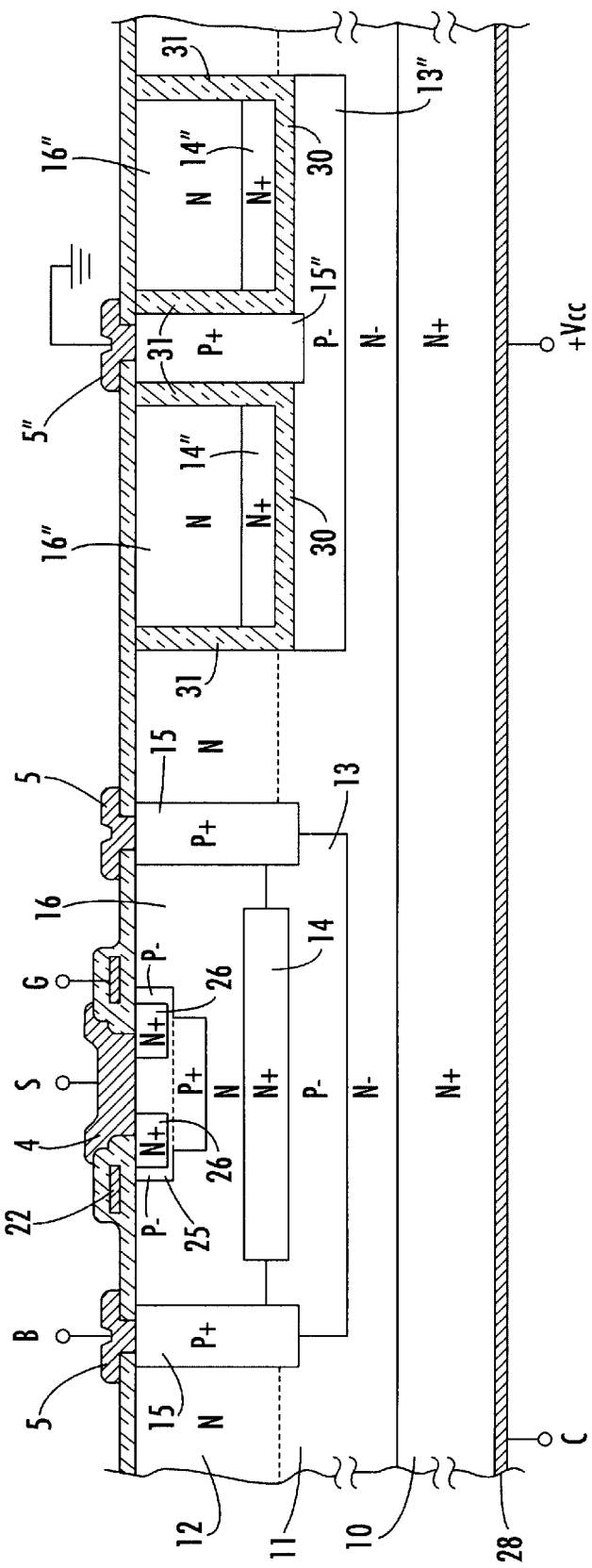
FIG. 3 is a sectional view of a portion of a chip of semiconductor material which shows a region, to contain a control circuit, of a device according to the invention with a dielectric insulation structure.

The structure according to the invention shown in FIG. 3 comprises a power device identical to that shown in FIG. 1 and a part containing a control circuit. Naturally, the emitter switching power device shown could be replaced by any other power device, such as, for example, a single vertical DMOS power transistor, a single vertical bipolar transistor, or an IGBT device. The components of the control circuit, which may be bipolar and MOS transistors, diodes, resistors and other devices commonly used for these types of circuits, are not shown, to not unnecessarily complicate the drawing. In this case also, regions produced by the same operations are indicated by the same reference number, but with double prime notation.

The principal operations of the process of manufacturing the structure according to the invention are summarized below. On a substrate 10 of mono-crystalline silicon, highly doped with N type impurities, there is formed, by epitaxial growth, a first layer 11 having the same type of conductivity but having a considerably lower concentration of impurities, and therefore indicated by—in the drawing. P– type regions 13 and 13" are formed on the surface of the epitaxial layer 11 by masking, implantation and diffusion at high temperature.

An operation of implanting oxygen in a high dose and at high energy, for example $2.5 \times 10^{18}$ ions/cm$^2$ and 200 keV, is then carried out, followed by an annealing phase at high temperature, for example 1300° C., by a technique normally used for the formation of SOI (Semiconductor On Insulator) wafers. This forms thin buried layers 30 of silicon dioxide which are separated from each other and are designed to provide the bottoms of the insulated regions of the control device. According to the invention, this implantation is carried out selectively, using a relatively thick layer of silicon dioxide as a mask, suitably defined by an ordinary photolithographic process. The layers 30 are formed at a depth of approximately 0.2 mm from the surface of the epitaxial layer 11, and have a thickness of approximately 0.3 mm.

A preliminary phase for the formation of N+ type regions 14 and 14" is carried out by a further operation of masking and implantation. A second N type layer 12 is then formed, again by epitaxial growth. In this phase, which is carried out at high temperature, the N+ type impurities implanted previously are extended by diffusion into the second epitaxial layer 12 and also into the first epitaxial layer 11 inside the diffused region 13 in the area designed for the power device, producing the buried regions 14 and 14". The buried regions 13 and 14 of the power device are designed to respectively provide the base and emitter regions of the bipolar transistor. The function of the buried region 13" of the control circuit will be explained below. The buried regions 14" are designed to provide, for example, collector and drain regions of bipolar or MOS transistors of the control circuit.

The process continues, using known techniques, with the formation of dielectric walls 31 to laterally define the insulated regions 16". In particular, selective anisotropic etching is used initially to form trenches, with a width of a few mm for example, extending from the front surface of the chip. In other words, these trenches extend from the surface of the second epitaxial layer 12, to the buried layers of oxide 30. Afterwards the trenches are filled with dielectric material, for example, silicon dioxide.

Further phases of masking, implantation and diffusion are then carried out to form the active regions of the power component inside the insulated region 16, such as those indicated by 25 and 26, and of the control circuit components inside the insulated regions 16" (not shown). The ordinary operations of deposition, masking and etching are then used to form the gate structure of the power device and the metal electrical contact strips for the electrodes and the interconnections of the various components. FIG. 3 shows only the contact electrode 28 on the bottom of the chip for the collector terminal C of the power device, the electrodes 4 and 5, which are the source electrode S and the base electrode B respectively of the power device, and an electrode 5" which provides a biasing terminal for the buried P− region 13". The electrode 5" is connected to the buried region 13" by a P+ deep contact region 15" disposed between the dielectric walls 31 of two adjacent insulated regions 16" and formed by the same operations as those used to form the deep base contact regions 15 of the power device.

In operation, the electrode 5", together with the regions 15" and 13", are connected to the terminal having the lowest available potential, usually ground potential. Since the insulated regions 16" are at relatively low potentials, the potential difference between the opposite faces of the dielectric layers is also low.

Figure 2:
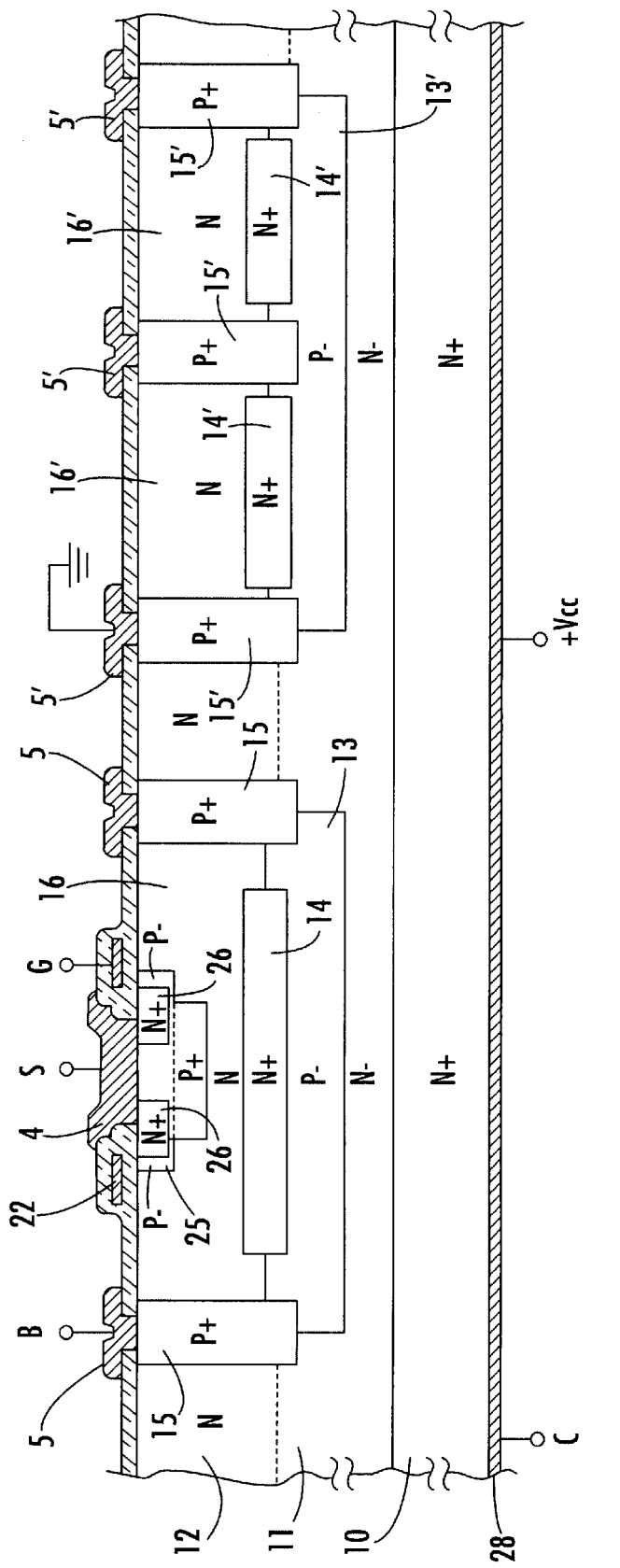
FIG. 2 is a sectional view of a portion of a chip of semiconductor material which shows a region, to contain a control circuit, with a junction insulation structure according to the prior art.

The thickness of the oxide layer 30, although very small, is therefore sufficient to ensure the insulation of the regions 16". Since the electrode 28 is normally connected to a high potential, the junction present between the buried P region 13" and the epitaxial layer 11 is reverse biased, as is the similar junction of the insulation structure according to the prior art (FIG. 2). This junction, however, no longer has the insulation function of the conventional structure, but only has the function of withstanding the high voltage between the electrodes 5" and 28.

The insulation structure of the device according to the invention has all the advantages of dielectric insulation with respect to junction insulation. Specifically, the insulation structure has virtually zero current leakage, low capacitance between the separate regions of the dielectric layer, and this capacitance is independent of variations of potential in the regions. Consequently, many of the parasitic components which arise in the conventional structure with junction insulation are not present or have no effect in the device according to the invention. Moreover, owing to the dielectric insulation, the area occupied by the control circuit is smaller than that of an identical circuit with junction insulation.

According to a variation of the invention, the vertical trench close to the power device may be deeper than that shown in the drawing; for example, it may extend to the bottom of the P− region 13", or even further. In this way, the dielectric wall 31 is extended laterally around the buried region 13", thus delimiting the side of the buried region 13" close to the power device. This arrangement may be suitable for completely eliminating the parasitic lateral PNP transistor formed by the P regions 13" and 15 and by the interposed portion of the N epitaxial layer 12.

According to another variation, the contact for biasing the buried region 13" may be provided by an electrically conducting element passing inside the dielectric walls 31. This electrically conducting element can be made by a modification of the process of forming the dielectric walls. According to this embodiment, after the formation of the trenches, the inner surfaces of the trenches are covered, by thermal oxidation for example, with a layer of silicon dioxide which is sufficiently thin to leave the trenches open. The layer which is formed on the bottoms of the trenches is removed by anisotropic etching, and the remaining space inside the trenches is filled with doped polycrystalline silicon. This creates a conducting path between the buried region 13" and the front surface of the chip. In this variation, the area of the control circuit is reduced further, since the P+ deep contact region indicated by 15" in FIG. 3 is not present. Naturally, it is not necessary for all the trenches to be treated in this way: it is sufficient for only a short portion of one of them to have the connecting element pass through it.

Although a single embodiment of the invention and a number of variations have been illustrated and described, numerous further variations are possible and are within the scope of the invention. For example, the dielectric insulation may be limited to the bottom layer 30 only or to the walls 31 only, if the parasitic components to be eliminated are essentially of the vertical or lateral type respectively. The buried region 13" could be formed independently of the buried region 13 of the power device to meet particular requirements of resistivity or particular process requirements. Moreover, the insulated regions 16", instead of having the same type of conductivity as the layer from which they must be insulated, could have the opposite conductivity. Naturally, in this case the dielectric insulation would have to be complete.

That which is claimed is:

1. A semiconductor device including a power component and a control circuit, comprising:
    a semiconductor substrate having a first type of conductivity;
    a buried region in the semiconductor substrate, having a second type of conductivity;
    at least one insulated region, containing at least part of the control circuit and disposed between an upper surface of the device and the buried region;
    a dielectric material delimiting at least part of the at least one insulated region; and
    electrical contacts for each of the buried region and the semiconductor substrate.

2. A device according to claim 1, wherein the dielectric material comprises a bottom layer which extends over the buried region.

3. A device according to claim 2, wherein the dielectric material comprises a wall which surrounds the insulated region.

4. A device according to claim 1, wherein the dielectric material comprises a wall which surrounds the insulated region.

5. A device according to claim 4, wherein the electrical contact for the buried region comprises an electrically conductive element which extends through a portion of the wall, and is in contact with the buried region.

6. A device according to claim 4, wherein at least part of the wall extends to a bottom of the buried region to laterally delimit the buried region.

7. A device according to claim 1, wherein the electrical contact for the buried region comprises:
    a surface contact electrode adjacent the upper surface of the device; and
    a connecting region having the second type of conductivity, and extending from the surface contact electrode to the buried region.

8. A device according to claim 1, wherein the at least one insulated region has the first type of conductivity.

9. A semiconductor device including a power component and a control circuit, comprising:

a semiconductor substrate having a first type of conductivity;

a buried region in the semiconductor substrate, having a second type of conductivity; and a dielectric material defining at least one insulated region of the semiconductor substrate between an upper surface of the device and the buried region, the insulated region containing at least part of the control circuit.

10. A semiconductor device according to claim 9, wherein the power component comprises an emitter switching power device.

11. A semiconductor device according to claim 10, wherein the emitter switching power device comprises a bipolar transistor and a MOSFET transistor.

12. A semiconductor device according to claim 9, wherein the power component comprises at least one of a vertical bipolar transistor, a vertical DMOS power transistor and an insulated gate bipolar transistor.

13. A semiconductor device according to claim 9, wherein the at least part of the control circuit comprises collector and drain regions of a transistor.

14. A semiconductor device according to claim 9, wherein the dielectric material comprises a bottom layer which extends over the buried region.

15. A semiconductor device according to claim 14, wherein the dielectric material comprises a wall which surrounds the insulated region.

16. A semiconductor device according to claim 9, wherein the dielectric material comprises a wall which surrounds the insulated region.

17. A semiconductor device according to claim 16, further comprising an electrical contact for the buried region, wherein the electrical contact comprises an electrically conductive element which extends through a portion of the wall and is in contact with the buried region.

18. A semiconductor device according to claim 16, wherein at least part of the wall extends to a bottom of the buried region to laterally delimit the buried region.

19. A semiconductor device according to claim 9, further comprising an electrical contact for the buried region, wherein the electrical contact comprises:

a surface contact electrode adjacent the upper surface of the device; and a connecting region having the second type of conductivity, and extending from the surface contact electrode to the buried region.

20. A semiconductor device according to claim 9, wherein the at least one insulated region has the first type of conductivity.

* * * * *

UNITED STATES PATENT AND TRADEMARK OFFICE
CERTIFICATE OF CORRECTION

PATENT NO.     : 6,525,392 B1
DATED          : February 25, 2003
INVENTOR(S)    : Leonardi It is certified that error appears in the above-identified patent and that said Letters Patent is hereby corrected as shown below:

<u>Title page,</u>
Item [75], delete "Aci S. Antonio(IT)" insert -- Aci S. Antonio (Catania)(IT) --

<u>Column 2,</u>
Line 14, delete "131" insert -- 13' --
Line 15, delete "13 and 15." insert -- 13' and 15'. --

Signed and Sealed this

Twenty-sixth Day of August, 2003

JAMES E. ROGAN
*Director of the United States Patent and Trademark Office*